(12) United States Patent
Sasaki

(10) Patent No.: US 6,690,581 B2
(45) Date of Patent: Feb. 10, 2004

(54) CONNECTION STRUCTURE OF FLEXIBLE BOARD ARRANGED IN CAMERA

(75) Inventor: Ryuta Sasaki, Saitama (JP)

(73) Assignee: Fuji Photo Optical Co., Ltd., Saitama (JP)

( * ) Notice: Subject to any disclaimer, the term of this patent is extended or adjusted under 35 U.S.C. 154(b) by 0 days.

(21) Appl. No.: 10/093,061

(22) Filed: Mar. 8, 2002

(65) Prior Publication Data

US 2002/0126458 A1 Sep. 12, 2002

(30) Foreign Application Priority Data

Mar. 8, 2001 (JP) .................................... 2001-064956

(51) Int. Cl.[7] ................................................ H05K 1/00
(52) U.S. Cl. .................................... 361/749; 396/352
(58) Field of Search ................................ 361/747, 749, 361/752, 756, 784; 439/67, 77, 493; 396/534, 539, 541, 542, 439; 174/177 FF, 254, 261

(56) References Cited

U.S. PATENT DOCUMENTS 4,711,548 A * 12/1987 Arakawa et al. ............ 396/542
5,059,129 A * 10/1991 Brodsky et al. ............... 439/67
5,160,269 A * 11/1992 Fox et al. ...................... 439/67
5,181,065 A * 1/1993 Hara ........................... 396/542
6,388,883 B1 * 5/2002 Serizawa et al. ............ 361/752

FOREIGN PATENT DOCUMENTS

JP 11084215 3/1999

* cited by examiner

Primary Examiner—David Martin
Assistant Examiner—Thanh S. Phan
(74) Attorney, Agent, or Firm—Birch, Stewart, Kolasch & Birch, LLP

(57) ABSTRACT

The connection structure of flexible boards permits efficient positioning and connecting of a plurality of flexible boards arranged one over the other in a camera by providing a pair of pin elements in a protruding condition in a base portion and forming on one of the pin elements a groove to be engaged with flexible boards. A lens device includes a base metal sheet of metal and pin elements of plastic provided in a protruding condition in the base metal sheet. The pin element has a groove formed on an outer periphery surface of the opposite side to the pin element. A main flex or a shutter flex has holes formed therein, into which the pin elements are to be inserted. A spacing between the holes is formed a little smaller than a spacing between the pin elements.

1 Claim, 10 Drawing Sheets

CONNECTION STRUCTURE OF FLEXIBLE BOARD ARRANGED IN CAMERA

BACKGROUND OF THE INVENTION

1. Field of the Invention

The present invention relates a connection structure of a flexible board arranged in a camera, and particularly to a connection structure of a plurality of flexible boards arranged one over the other.

2. Description of the Related Art

Japanese Patent Application Publication No. 11-84215 discloses a lens device provided with a zoom position detection device. The zoom position detection device comprises a cord plate rotating during zooming and a sliding brush slidably fixed to the cord plate. Thus, the sliding brush reads conductor patterns formed on the cord plate to detect a zoom position.

In such a lens device, a plurality of flexible boards are usually arranged one over the other. After the plurality of flexible boards are stacked on a base portion such that the board terminal portions of the respective boards may be aligned with each other, then the respective board terminal portions are joined together by soldering.

As a material of the base portion on which the flexible boards are mounted, a plastic material has been conventionally used. Small protrusions (for example, of which diameter is about 1 mm) for engaging with the flexible boards are formed on the base portion of plastic. The flexible boards are positioned by engaging this protrusion with the flexible boards positions.

On the other hand, as the lens device is made smaller, the base portion has become so thin as to be deficient in strength, and therefore, today, a base portion of metal is used. In using the base portion of metal, it is difficult to make a small protrusion for engaging with the flexible boards. As a result, as shown in FIG. 11, after flexible boards 1, 2, and 3 are stacked on a base portion 4, these boards are fastened to it at three positions by screws 5, 6, and 7 while aligning the position of a board terminal portion 1a with the position of a board terminal portion 2a, and aligning the position of a board terminal portion 1b with the position of a board terminal portion 3b.

However, positioning and screwing of the plurality of flexible boards 1, 2, and 3 have been very difficult work to be done at the same time, thus resulting in very poor assembly performance.

SUMMARY OF THE INVENTION

The present invention has been achieved considering these situations, and has an object to provide a connection structure of flexible boards which permits efficient positioning and connecting of a plurality of flexible boards arranged one over the other in a camera.

In order to attain the above described object, the present invention is directed to a connection structure of flexible boards in which a plurality of boards are stacked on a base portion of a camera so as to be arranged in the camera, wherein: a pair of holes is formed in each of the flexible boards; a pair of pin elements to be inserted into the pair of holes is provided in a protruding condition in the base portion, in which a spacing between the pair of pin elements is larger than a spacing between the pair of holes, and one of the pair of pin elements has a groove formed on an outer periphery surface of a side thereof opposite to a side thereof that faces to the other of the pair of pin elements; and the plurality of flexible boards are fixed on the base portion in the state in which an inner periphery edge of each one hole of the plurality of flexible boards are fitted in the groove.

According to the present invention, after a pin element having a groove is inserted into one hole of a pair of holes formed in a flexible board, while the flexible board is being engaged with the groove of the pin element, another pin element is inserted into the other hole, thereby permitting the flexible board to be mounted on the base portion with the flexible boards positioned. By mounting a plurality of flexible boards on the base portion, the plurality of flexible boards are stacked on top of each other with the flexible boards positioned, and therefore the plurality of positioned flexible boards can be fixed at the same time by fixing at only one position by screwing. Thereby, it is made possible to improve the assembly efficiency of a camera using a plurality of flexible boards.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Hereinafter, a preferred embodiment of a connection structure of a flexible board arranged in a camera according to the present invention will be described with reference to the drawings.

Figure 1:
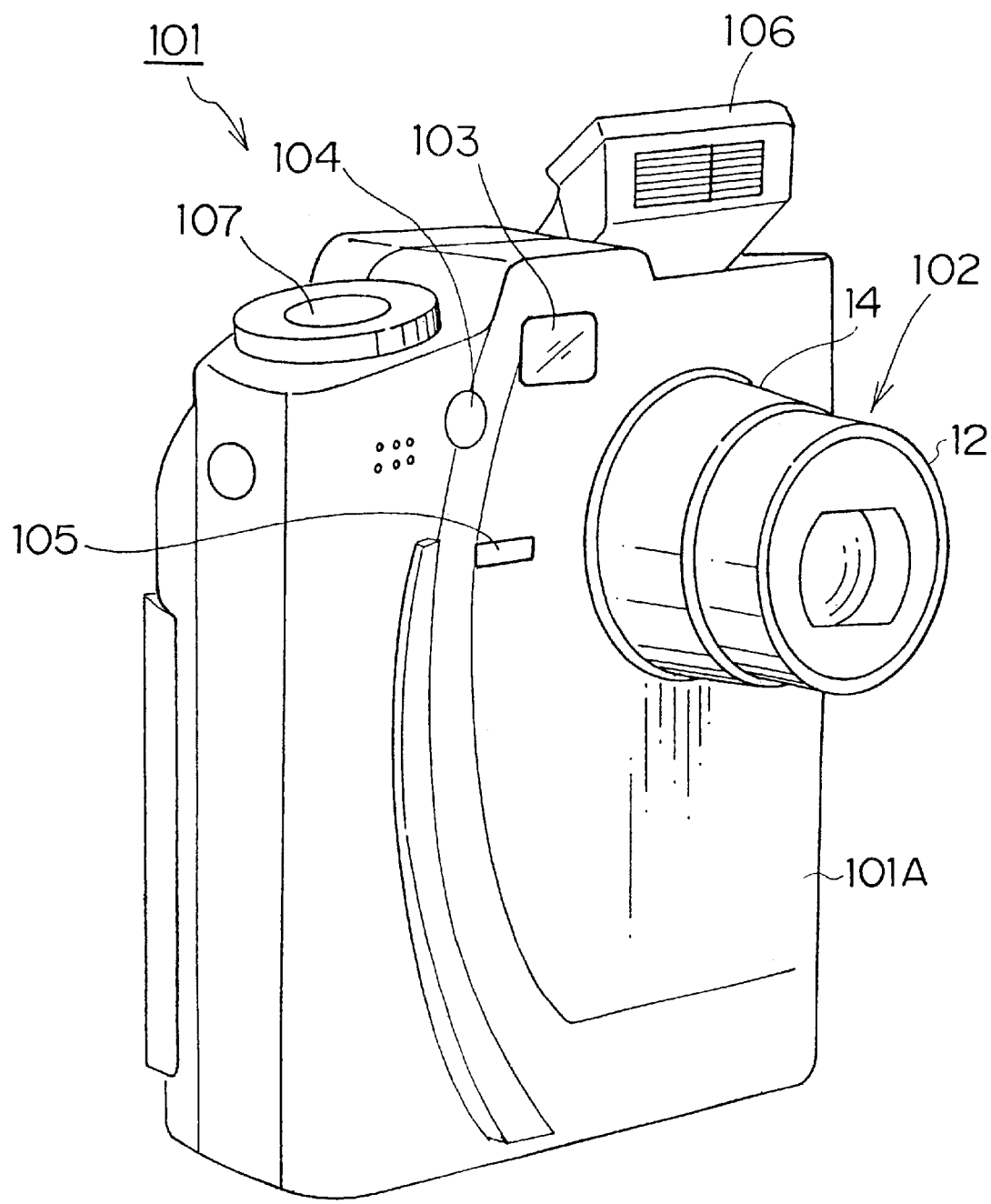
FIG. 1 is a perspective view showing an electronic still camera to which a connection structure of flexible boards according to the present invention is applied.

FIG. 1 is an external view of an electronic still camera 101 to which the connection structure of a flexible board according to the present invention is applied. The camera body 101A of the electronic still camera 101 is formed in a box shape of a rectangle. In the front surface of the body 101A, a lens device 102, a finder window 103, a flash dimmer sensor 104, and a self-timer lamp 105 are arranged at each predetermined position. Also, a pop-up flash 106 and a release switch 107 are arranged in the upper surface of the body 101A, and a finder eyepiece, a liquid crystal display panel, control keys and the other, which are not shown, are arranged in the back surface of the body 101A, respectively. The lens device 102 is collapsible into the body 101A when the camera is carried. Thus, only during use, a lens barrel 12 and a movable barrel 14 (see FIG. 2) are delivered out forward from the front surface of the body 101A (in the direction of the subject).

Figure 2:
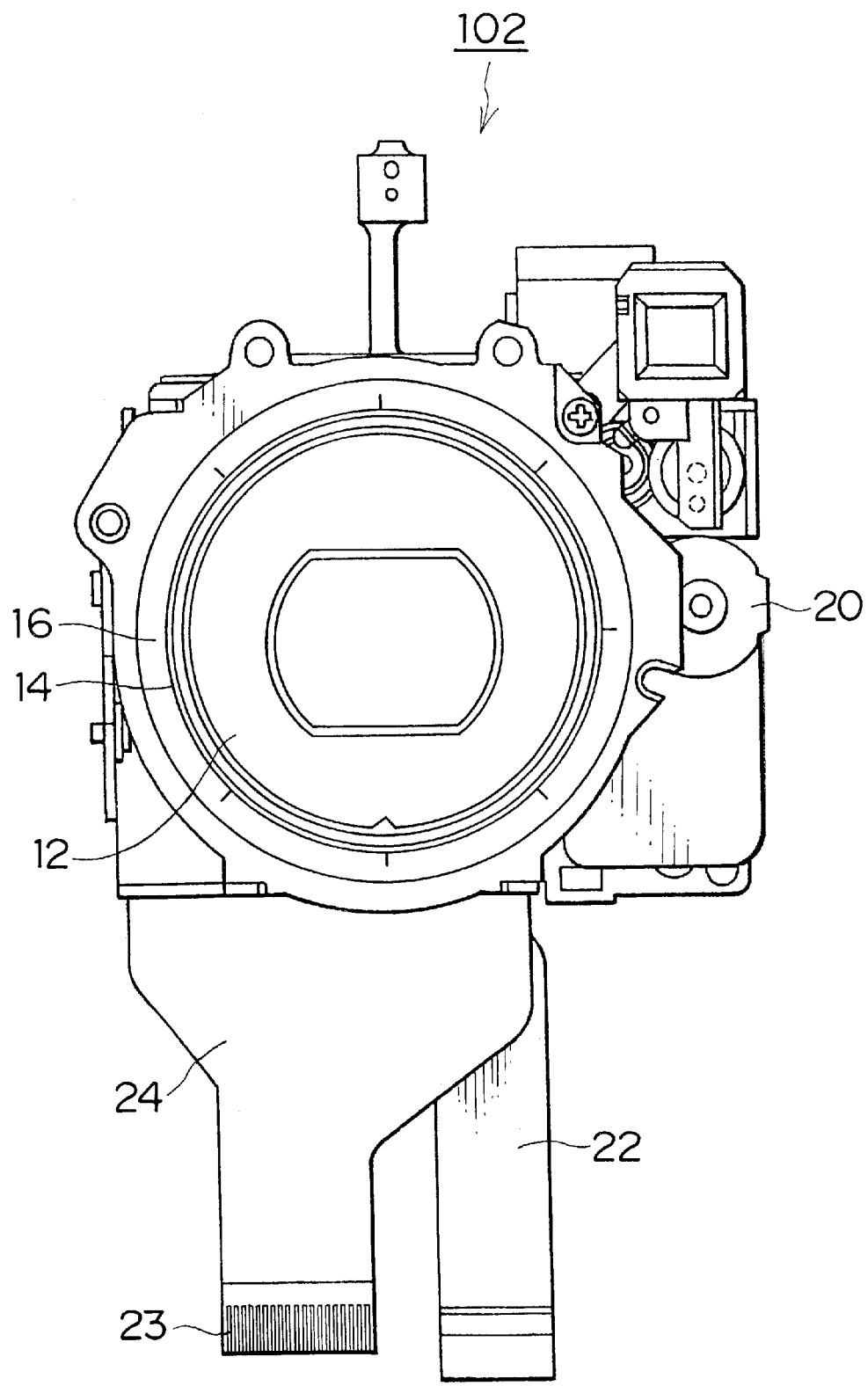
FIG. 2 is a front view showing a lens device shown in FIG. 1.
Figure 3:
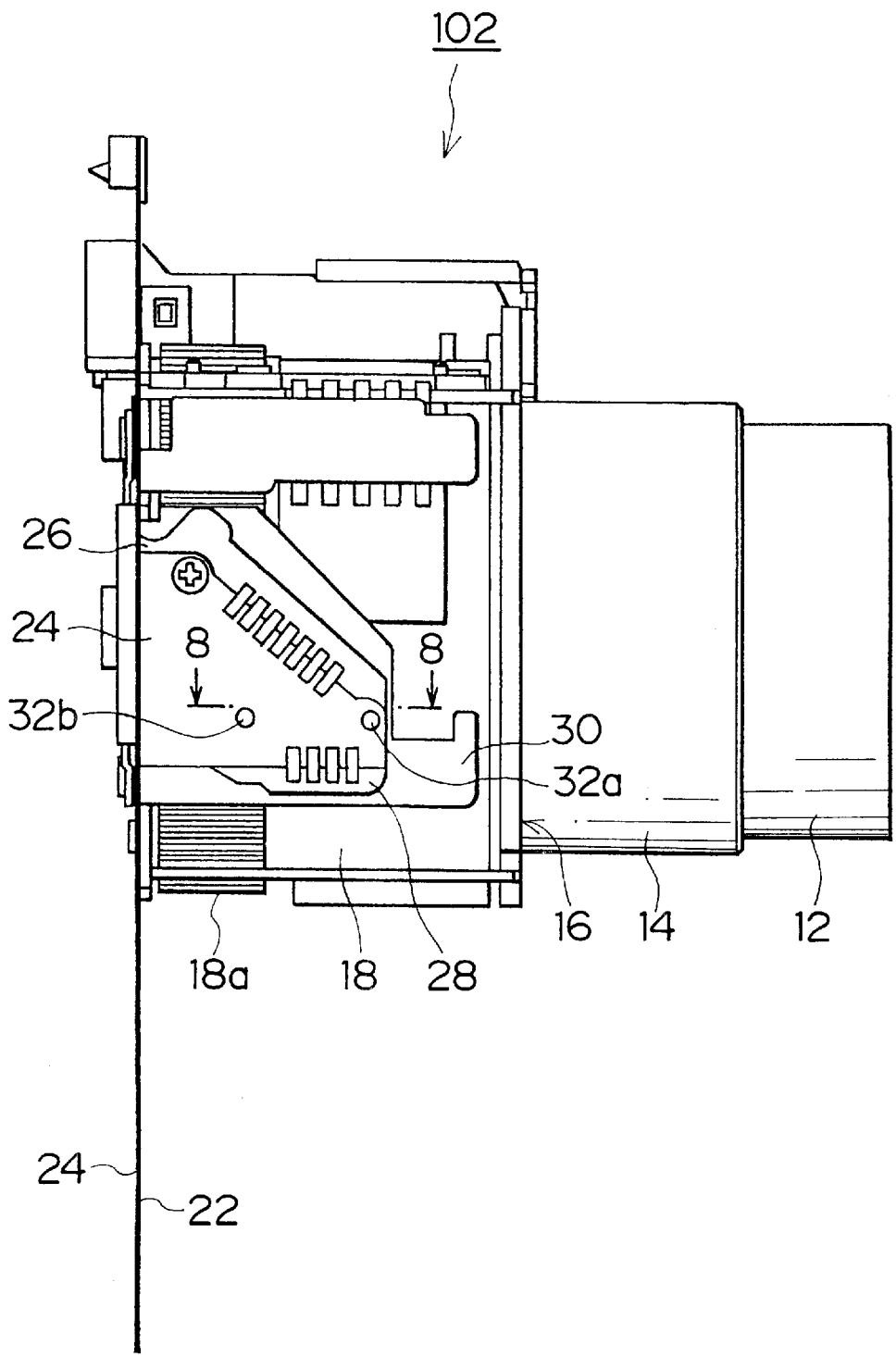
FIG. 3 is a left side view showing the lens device shown in FIG. 2.
Figure 4:
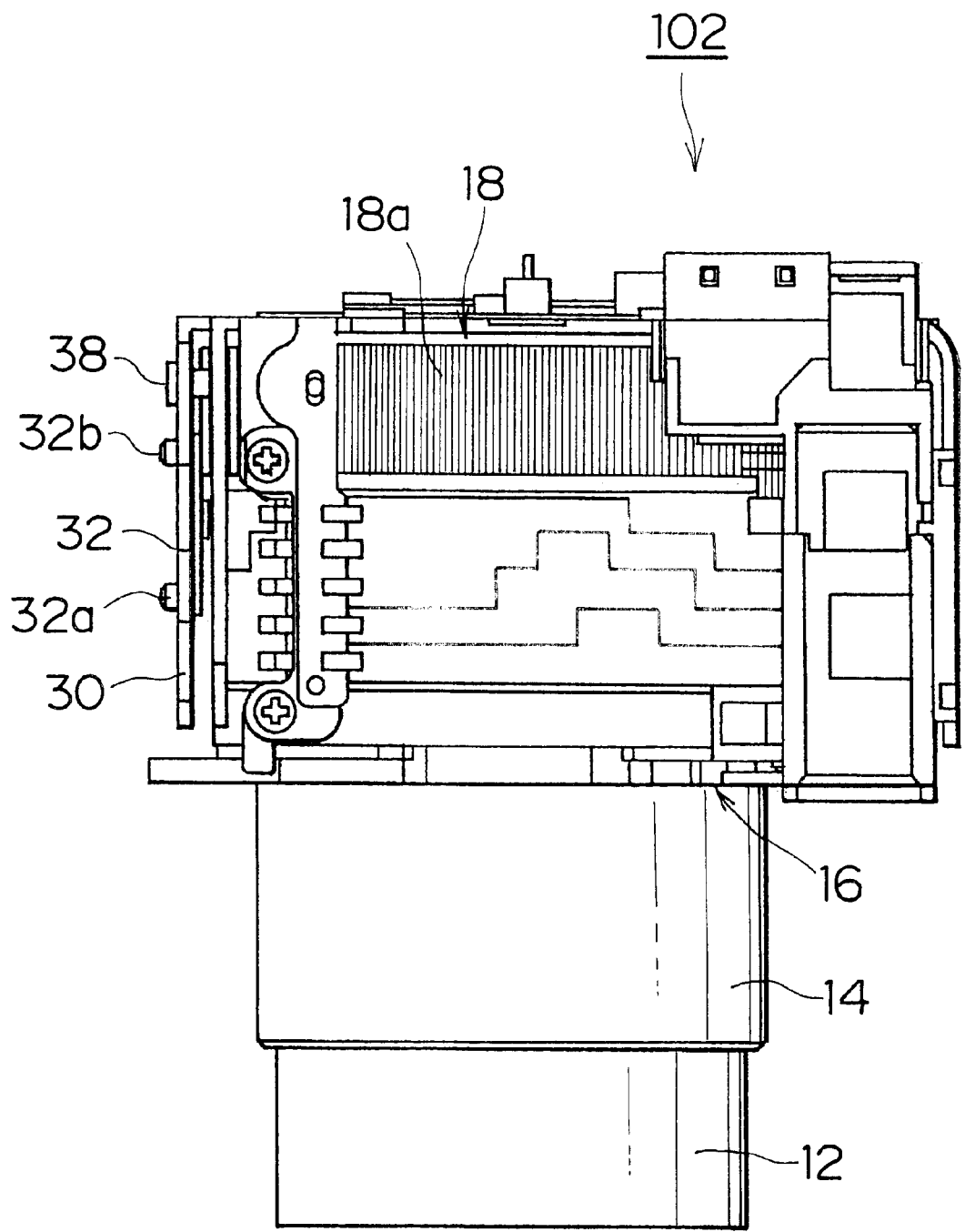
FIG. 4 is a plan view showing the lens device shown in FIG. 2.

FIG. 2, FIG. 3, and FIG. 4 are a front view, a left side view, and a plan view of the lens device 102, respectively. As shown in these drawings, the lens device 102 comprises the lens barrel 12, the movable barrel 14, a fixed barrel 16 and a rotary barrel 18.

A gear portion 18a is formed in the outer periphery of the rotary barrel 18, and the driving force of a zoom motor 20 is transferred to the gear portion 18a. The rotary barrel 18 is rotated in engagement with the periphery of the fixed barrel 16 by the driving force of the zoom motor 20 transferred to the gear portion 18a. The movable barrel 14 moves along the optical axis with respect to the fixed barrel 16 while rotating in response to the rotation of the rotary barrel 18. The lens barrel 12 travels in a straight line along the optical axis with respect to the movable barrel 14 by the rotation of the movable barrel 14.

When the rotary barrel 18 rotates from an "initial position" to a "midpoint position" in a "housed rotary range", the lens device 102 is changed from a state of the collapsed position to a state of a tele-position. Also, by the rotation of the rotary barrel 18 from the "midpoint position" to an "end position" in a "variable power rotary range", the lens device 102 is changed from a state of the tele-position to a state of a wide-position.

Figure 5:
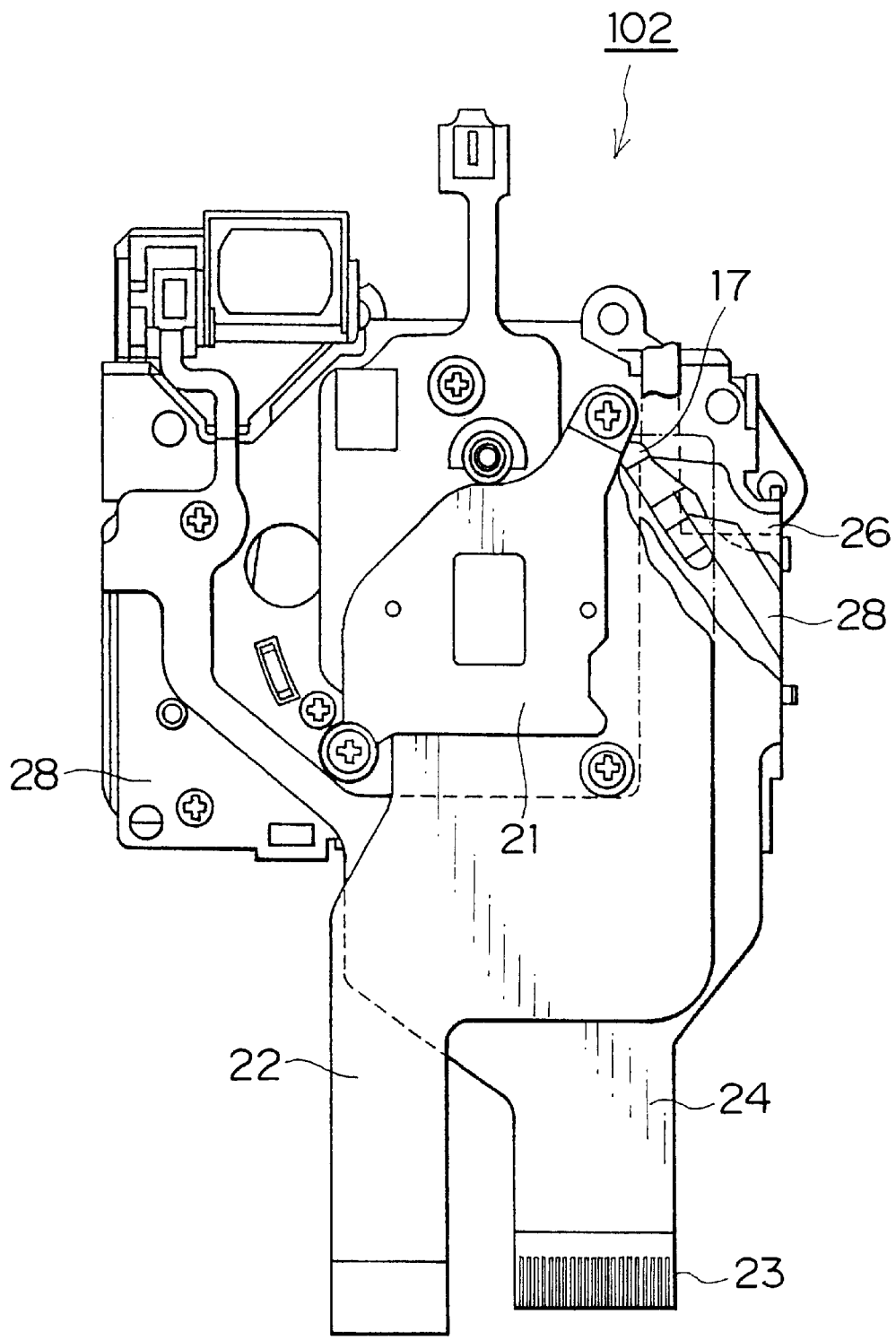
FIG. 5 is a rear view showing the lens device shown in FIG. 2.

By the way, as shown in FIG. 5, the lens device 102 comprises a CCD flexible board (hereinafter, referred to as CCD flex) 22, a main flexible board (hereinafter, referred to as main flex) 24, a focus-driving flexible board (hereinafter, referred to as focus flex) 26, a shutter-driving flexible board (hereinafter, referred to as shutter flex) 28.

A CCD (solid state imaging device) not shown is mounted on the CCD flex 22, wherein it is fixed thereon by a pressure plate 21.

The focus flex 26 and the shutter flex 28 are connected to an actuator (not shown) provided in the inside of the fixed barrel 16 and pulled out to the outside through an opening 17 therefrom.

Figure 6:
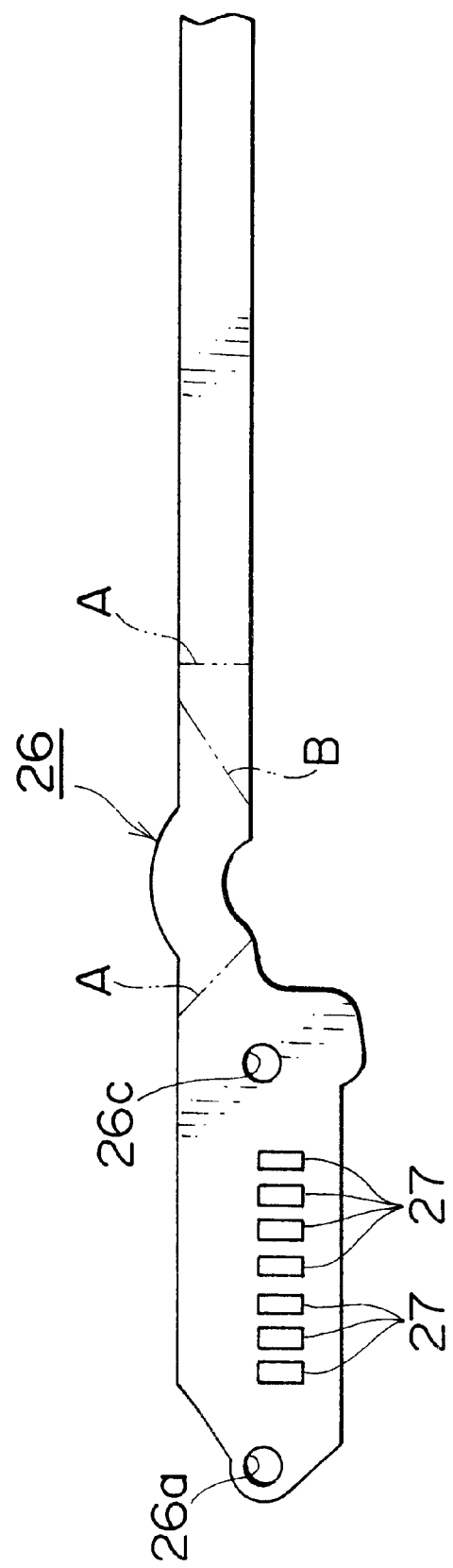
FIG. 6 is a development diagram showing a flexible board for use in focus driving.
Figure 7:
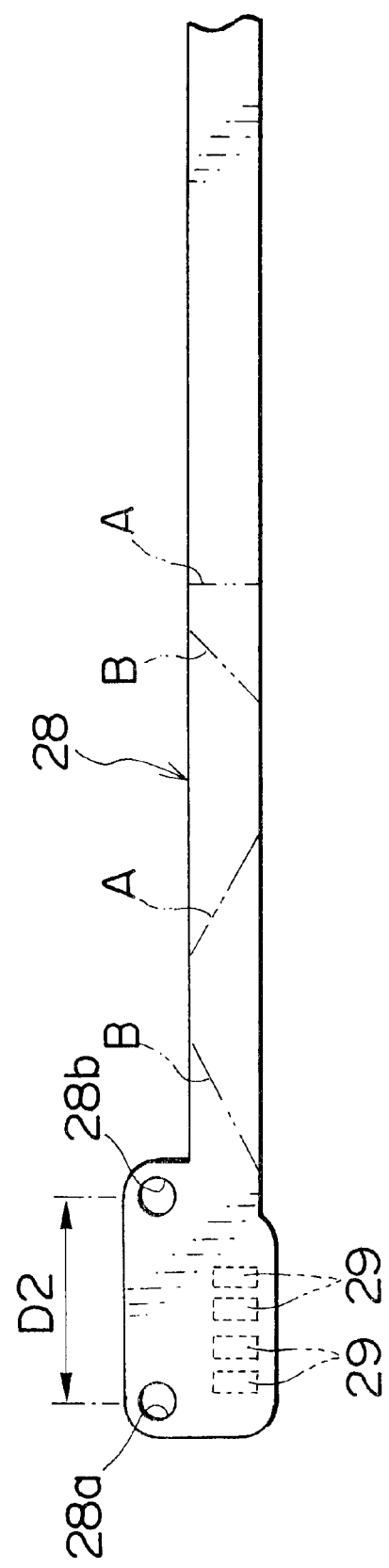
FIG. 7 is a development diagram showing the flexible board for use in shutter driving.

FIG. 6 is a development diagram of the focus flex 26 and FIG. 7 is a development diagram of the shutter flex 28. As shown in these diagrams, the focus flex 26 and the shutter flex 28 are formed in the shape of a nearly straight line, and the width of them is formed smaller than the width of the opening 17. The focus flex 26 and the shutter flex 28 pulled out from the opening 17 are bent two or more times and led to the left side of the lens device 102. The times of bending of the focus flex 26 and the shutter flex 28 are determined by the orientation of board terminal portions 27 and 29 when they are pulled out from the opening 17. For example, when viewed from the left side of the lens device 102, if the board terminal portion 27 are positioned on the surface of the flex as in the focus flex 26 shown in FIG. 6, the flex is then bent odd times (three times). On the other hand, if the board terminal portion 29 is positioned on the underside of the flex as in the shutter flex 28 as shown in FIG. 7, the flex is bent even times (four times). Thereby, the focus flex 26 and the shutter flex 28 pulled out from the opening 16a shown in FIG. 5 are led to the left side of the lens device 102 while engaging with a base metal sheet 30, and thus the board terminal portion 27 of the focus flex 26 and the board terminal portion 29 of the shutter flex 28 are placed on a exterior surface of the lens device 102. By the way, in FIG. 6 and FIG. 7, a double-dotted line A shows a bent curve which is bent 90 degrees on the base metal sheet 30. Also, a double-dotted line B shows a bent curve that is bent 180 degrees in engagement with the base metal sheet 30.

Figure 8:
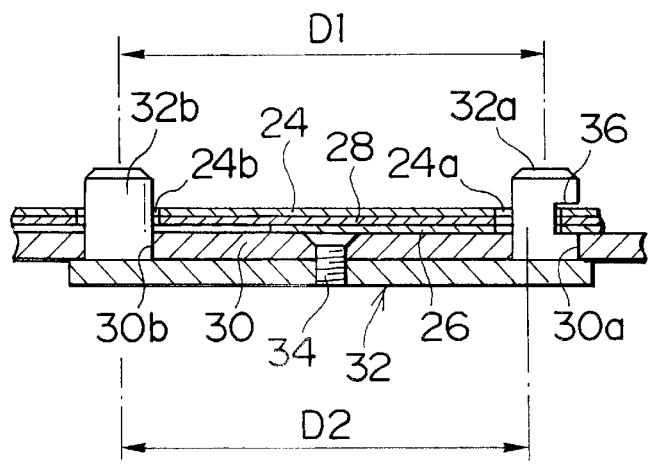
FIG. 8 is a sectional view of a positioning element along a line 8—8 of FIG. 3.
Figure 9:
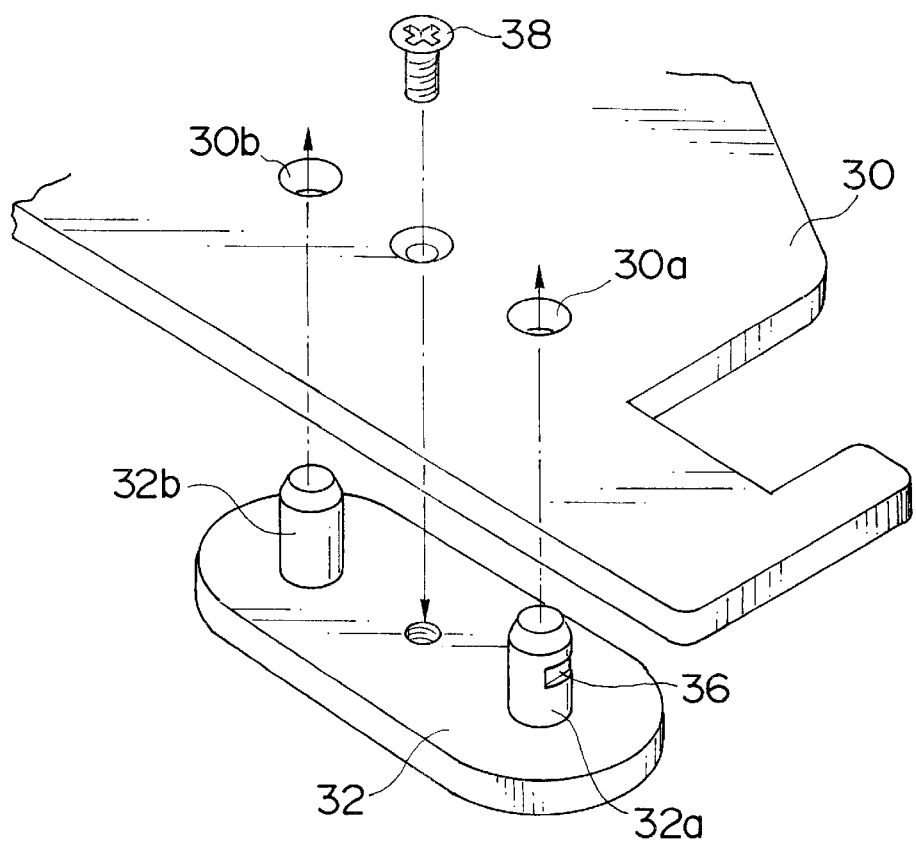
FIG. 9 is a perspective view showing the positioning element.

As shown in FIG. 3 and FIG. 8, the metal sheet made of metal 30 is provided on the left side of the lens device 102, and a positioning element of plastic 32 is mounted on this metal sheet 30. As shown in FIG. 9, the positioning element 32 has a pair of pin elements 32a and 32b provided in a protruding condition. The pin element 32a of the pair of pin elements 32a and 32b is placed in the front side of the lens device 102 and has a groove 36 formed on the outer periphery of the front side. Here, after the pair of pin elements 32a and 32b are inserted into holes 30a and 30b of the base metal sheet 30 from the inside of the lens device 102, the positioning element 32 are fixed to the metal sheet 30 by a screw 38.

The pin elements 32a and 32b are inserted into the focus flex 26, shutter flex 28, and main flex 24, thereby positioning them to each other as follows. That is, as shown in FIG. 6, a hole 26a is formed in the focus flex 26 and the pin element 32a is to be inserted into the hole 26a. Also, as shown in FIG. 7, holes 28a and 28b are formed in the shutter flex 28, and the pin elements 32a and 32b are to be inserted into the holes 28a and 28b, respectively. A spacing D2 between the pair of holes 28a and 28b is formed a little smaller than a spacing D1 between the pair of pin elements 32a and 32b (see FIG. 8). Further, as shown in FIG. 8, a pair of holes 24a and 24b, into which the pin elements 32a and 32b are to be inserted, are formed in the main flex 24. A spacing between the pair of holes 24a and 24b of the main flex 24 is formed in the same dimension as the spacing D2 between the pair of holes 28a and 28b of the shutter flex 28.

Also, as shown in FIG. 7, a hole 26c, into which a screw 38 is to be inserted, is formed in the focus flex 26, and a hole 24, as shown in FIG. 8, into which the screw 38 is to be inserted, is formed in the main flex 24.

As shown in FIG. 3, the main flex 24 is provided with a board terminal portion 25a to be joined to the board terminal portion 27 of the focus flex 26 (see FIG. 6) and a board terminal portion 25b to be joined to the board terminal portion 29 of the shutter flex 28 (see FIG. 7). Also, the main flex 24 is provided with a connector portion 23 to be connected with an electronic component (not shown) of a digital still camera device 1.

Next, a method of assembling the main flex 24, shutter flex 26, and shutter flex 28 will be described.

Figure 10A:
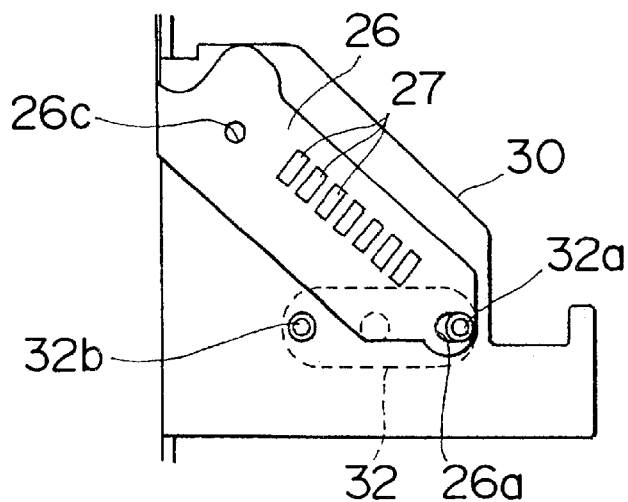
FIGS. 10(A), 10(B) and 10(C) are diagrammatic illustrations of a method of assembling the flexible board.

First, the pin element 32a is inserted into the hole 26a of the focus flex 26. After that, the focus flex 26 is moved in the rear side of the lens device 102, and thereby the focus flex 26 is engaged with the groove 36 of the pin element 32a. Thereby, the focus flex 26 is mounted as shown in FIG. 10(A).

Figure 10B:
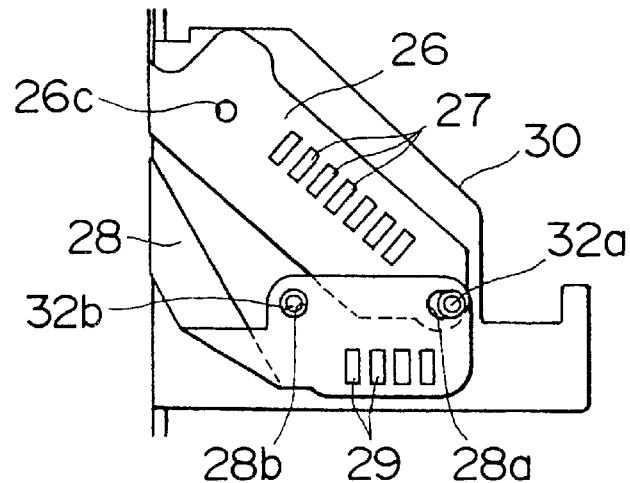

Next, the pin element 32a is inserted into the hole 28a of the shutter flex 28. Then, the shutter flex 28 is moved in the rear side of the lens device 102 and then while the shutter flex 28 is being engaged with the groove 36, the pin element 32b is inserted into the hole 28b of the shutter flex 28. At this time, because the spacing D2 between the pair of hole 28a and 28b has been made a little smaller than the spacing D1 between the pair of pin elements 32a and 32b, the shutter flex 28 is kept engaged with the groove 36 of the pin element 32a. Thereby, the shutter flex 28 is positioned and mounted as shown in FIG. 10(B).

Figure 10C:
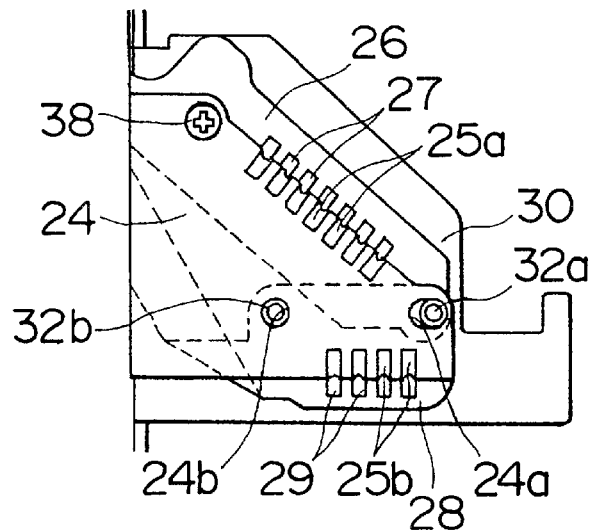
Figure 11:
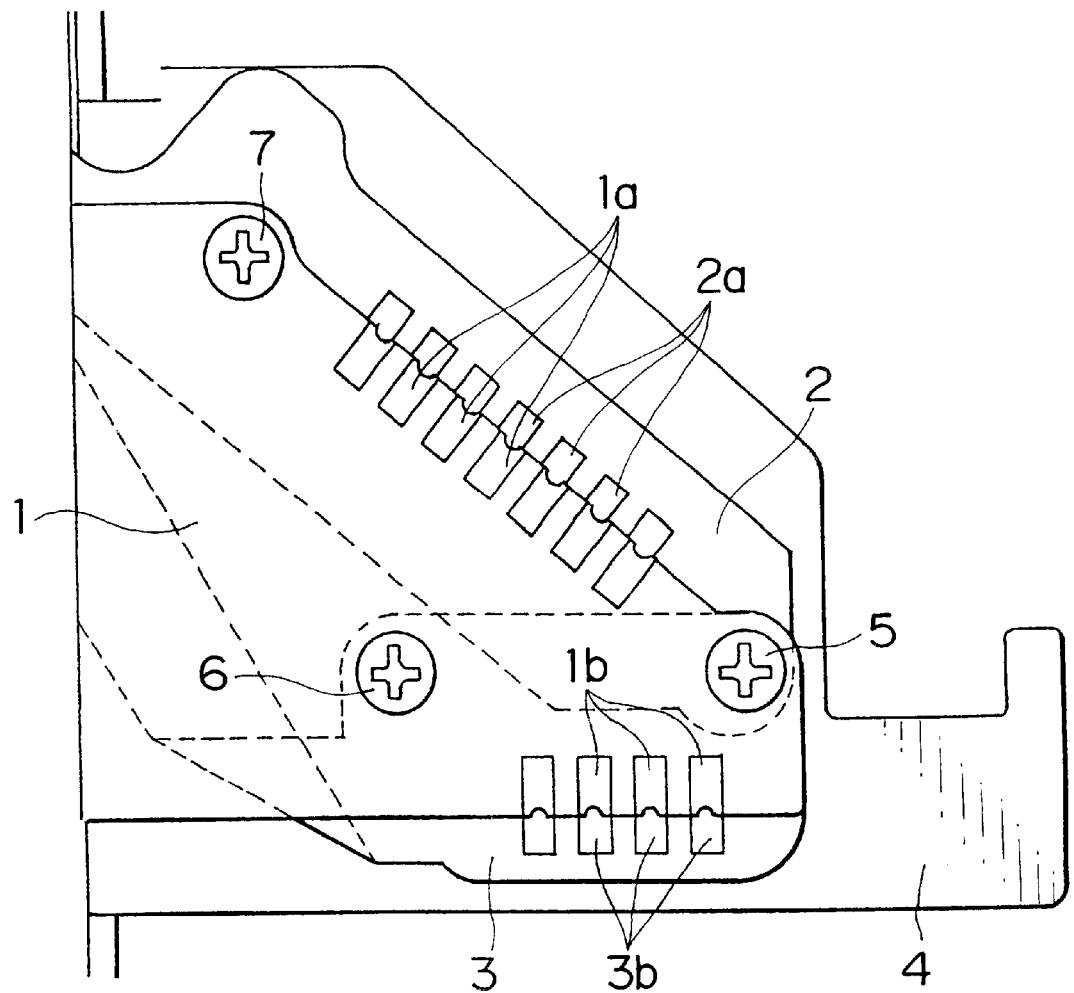
FIG. 11 is a diagram showing a conventional connection structure of flexible boards.

Next, the main flex 24 is mounted in the same manner as the shutter flex 28. That is, after the pin element 32a is inserted into the hole 24a of the main flex 24, while the main flex 24 is being engaged with the groove 36 of the pin element 32a, the pin element 32b is inserted into the hole 24b. Thereby, the main flex 24 is positioned and mounted as shown in FIG. 10(C).

Next, after the position of the hole 26c is aligned with the hole 24c of the main flex 24 with the focus flex 26 swung around the pin element 32a, the screw 38 is screwed into the metal sheet 30 through the holes 24c and 26c. Thereby, the focus flex 26, and the main flex 24 are fixed and also the shutter flex 28 pressed by the main flex 24 is fixed at the same time.

In this way, according to the present embodiment, the pair of pin elements 32a and 32b are provided in a protruding condition in the base metal sheet 30 and at the same time, the main flex 24, focus flex 26 and shutter flex 28 are engaged with these pin elements 32a and 32b and thereby positioned. Therefore, only screwing at one position by the screw 38 enables the three flexible boards 24, 26 and 28 to be fixed with the three boards positioned, thereby permitting an increase in the assembly efficiency of the lens device 102.

Also, since the pair of pin elements 32a and 32b are fabricated as special structures separate from the base metal sheet 30, the base metal sheet 30 can be formed of metal to assure the strength of the base metal sheet 30, and it is possible at the same time to form small pin elements 32a and 32b.

By the way, the embodiment described above has made the focus flex 26 engaged with only the pin element 32a, but the focus flex may be also engaged with the pin element 32b and thereby positioned.

Also, the shutter flex 28 may be fixed by the screw 38 in the same manner as the main flex 24 and the focus flex 26.

Also, the present invention can be applied to the case in which two or four or more flexible boards are fixed at the same time.

As described above, according to the connection structure in accordance with the present invention, after a pin element having a groove is inserted into one hole of a pair of holes formed in a flexible board, while this flexible board is being engaged with the groove of the pin element, another pin element is inserted into the other hole. Therefore, the flexible board can be mounted on a base portion in a positioned state, and also a plurality of flexible boards can be fixed while they are being positioned. Thereby, it is possible to improve the assembly efficiency of a lens device using a plurality of flexible boards.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A connection structure of flexible boards in which a plurality of boards are stacked on a base portion of a camera so as to be arranged in the camera, wherein:

a pair of holes is formed in each of the flexible boards;

a pair of pin elements to be inserted into the pair of holes is provided in a protruding condition in the base portion, in which a spacing between the pair of pin elements is larger than a spacing between the pair of holes, and one of the pair of pin elements has a groove formed on an outer periphery surface of a side thereof opposite to a side thereof that faces to the other of the pair of pin elements; and the plurality of flexible boards are fixed on the base portion in the state in which an inner periphery edge of each one hole of the plurality of flexible boards are fitted in the groove.

* * * * *